United States Patent
Huo et al.

(10) Patent No.: US 7,403,864 B2
(45) Date of Patent: Jul. 22, 2008

(54) METHOD AND SYSTEM FOR CENTRALLY-CONTROLLED SEMICONDUCTOR WAFER CORRELATION

(75) Inventors: Hsing Ya Huo, Kaohsiung (TW); Chung-Lin Hsieh, Kaohsiung (TW); Tsung-Yu Lee, Tainan (TW); Yang Yen-Ni, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 11/556,724

(22) Filed: Nov. 6, 2006

(65) Prior Publication Data

US 2008/0106278 A1   May 8, 2008

(51) Int. Cl.
*G01R 31/01* (2006.01)
*G01N 37/00* (2006.01)

(52) U.S. Cl. ................................................ 702/81
(58) Field of Classification Search .................... 702/81
See application file for complete search history.

(56) References Cited

U.S. PATENT DOCUMENTS

| | | | |
|---|---|---|---|
| 6,236,952 B1* | 5/2001 | Jun et al. | 702/119 |
| 7,225,107 B2* | 5/2007 | Buxton et al. | 702/183 |
| 2002/0121915 A1* | 9/2002 | Alonso Montull et al. | 324/765 |
| 2004/0210413 A1* | 10/2004 | Dorough et al. | 702/117 |
| 2006/0226864 A1* | 10/2006 | Kramer | 324/765 |
| 2007/0055467 A1* | 3/2007 | Tsuji et al. | 702/81 |
| 2007/0132477 A1* | 6/2007 | Balog et al. | 324/765 |

* cited by examiner

*Primary Examiner*—John E Barlow, Jr.
*Assistant Examiner*—Cindy H Khuu
(74) *Attorney, Agent, or Firm*—Baker & McKenzie LLP

(57) ABSTRACT

A centrally-controlled correlation system for testing a correlation wafer and comparing the testing results with the wafer's reference data that has been determined previously. The testing instructions and the correlation criteria are stored and transmitted from a central database. Such centrally-controlled correlation system improves the reliability of the correlation results and reduces the time to correlate a correlation wafer.

14 Claims, 4 Drawing Sheets

METHOD AND SYSTEM FOR CENTRALLY-CONTROLLED SEMICONDUCTOR WAFER CORRELATION

TECHNICAL FIELD

This disclosure relates to testing of semiconductor circuitry and more in particular to testing of semiconductor circuitry using correlation techniques.

BACKGROUND

As semiconductor devices become increasingly complex, so does the time required to properly test these devices. Considering the high volume production of some semiconductor devices, such an increase in testing time and the corresponding testing cost can significantly increase the cost of the final product. Additionally, semiconductor devices are often manufactured in more than one location, often by different subcontractors or fabrication companies. This often results in different testing specifications between the sites because different tests and testing procedures may be used. Consequently, minimizing the testing time and standardizing the testing specifications are two challenges for any wafer-testing process.

Wafer-testing is physically conducted by a device known as prober. The prober holds a probe card, on which needle-like probe pins are aligned in a configuration that corresponds to a specific semiconductor device. Through the probe pins, the prober makes electrical contact with the dice on a wafer and performs various test patterns, which are also called test programs. Different semiconductor devices require different testing programs. A die may pass all or just some of the test programs, and based on such testing results, the die is then categorized as good, bad, or even some other classifications. The process for wafer testing has already been addressed by prior art such as the Taiwanese patent issued to Jeng et al. (TW 516149).

During the wafer-testing process, high failure rate at specific die locations or low overall yield rate are often indications that there might be a defect in the wafer fabrication process. The defect may locate either in the production stage or in the testing stage of the wafer manufacturing process. There are several possible defects that can occur in the testing stage of the process. One possible defect is the faulty design of the test programs. Another possible defect is the mechanical failure of testing equipments. The probe pins on the probe card may be misaligned or the prober's hold of the probe card may become loose. The prober itself may also suffer mechanical failures such as leaking hydraulic fluid or coolant. Often times, these problems arise simply due to the wear and tear of the testing process.

Moreover, an existing defect may come with a new piece of testing equipment. Improper maintenance of the testing equipments may also cause an equipment defect. Thus, it is important to ensure that there is no defect before starting up a new testing equipment or restarting an existing testing equipment that has been serviced.

A technique known as wafer correlation has been used to diagnose the existence and location of a defect. Correlation involves first choosing a test wafer and determining the locations of the good and bad dice on the correlation wafer. The test wafer is often called a correlation wafer. One way to make such determination is to test the correlation wafer using testing equipments that are working properly. Using the testing results of the correlation wafer, a reference map recording the location of the good and bad dice is generated and stored as reference data. Before startup or restart, or after a defect is suspected, an operator would test the same correlation wafer to again determine the locations of the good and bad dice. The operator then applies a set of correlation criteria to compare the test results with the previously-determined reference data and determine the number of matching dice. The testing results and reference data correlate only if the number of matching dice exceeds a threshold number. If the testing results correlate with the previously-determined reference data, then there is either no defect, or a defect is located in the production stage. If the test results do not correlate with the previously-determined reference data, then a defect is likely located in the testing stage.

Although wafer correlation is an important diagnostic technique, it has several disadvantages. First, it increases the cost of production because the correlation process takes up labor and machine time that can otherwise be used for production. Running correlation is a labor-intensive task because the comparison of testing results and reference data has been done manually by an operator or engineer. Running correlation also requires machine time, which is proportionate to the number of dice that are sampled for testing. Thus, an inefficient sample size would increase the machine time required. An inefficient sample size can also reduce the life span of a correlation wafer as each wafer can only be tested for a limited number of times before becoming damaged; in turn, a shorten life span would require more labor and machine time to be spent to prepare another correlation wafer.

Second, the correlation results are sometimes inconsistent and unreliable. Often times, wafers are manufactured and tested by independent subcontractors at different sites and the subcontractor at each site may have developed different sets of correlation criteria. For example, subcontractors may have different correlation-passing requirement. A subcontractor may require 97% of the dice to have matching testing results while a different subcontractor may lower the requirement to 95%. As another example, some subcontractors do not treat a good die becoming bad die as non-matching because this change may be attributed to the normal wear and tear involved in wafer-testing; but some other subcontractors treat it as non-matching. Applying different sets of correlation criteria, a subcontractor may conclude that a defect exists in the testing equipments while another subcontractor at another site may conclude otherwise. The inconsistent correlation results may lead to more inaccurate wafer-testing results.

Because wafer correlation is an important diagnostic technique, there exists a need for an efficient and reliable correlation system and a method of using such correlation system. In particular, there is a need to minimize labor and machine time and turn out consistent correlation results.

SUMMARY

The centrally-controlled correlation system substantially meets these needs and others. Disclosed herein is a wafer correlation diagnostic technique in which a correlation wafer is tested and its testing results are compared to its previously-determined reference data. Using a centrally-controlled correlation system, the process time for the wafer correlation can be reduced and the consistency of the wafer correlation results can be improved.

In an embodiment, the centrally-controlled correlation system includes a database, an instruction-server module, a testing-control module, and a prober. The database stores the testing instructions for testing the correlation wafer and correlation criteria for comparing the testing results with the previously-determined reference data. The instruction-server module identifies, at the database, the testing instructions and transmits them to the testing-control module. According to the testing instructions, the instruction-server module outputs electrical signals to the prober, which tests the correlation wafer accordingly. Either the instruction-server module or the testing-control module may apply the correlation criteria identified by the instruction-server module and determines whether the testing results correlates with the previously-determined reference data.

According to another aspect of the disclosure, a method for wafer correlation includes identifying at a database, testing instructions for testing the correlation wafer and correlation criteria for comparing the testing results with the previously-determined reference data. The method further includes transmitting the testing instructions from an instruction-server module to a testing-control module.

In yet another aspect of the disclosure, an instruction system for wafer correlation is provided that includes a database operable to store the testing instructions for testing the correlation wafer and correlation criteria for comparing the testing results with the previously-determined reference data. The system further includes an instruction-server module operable to identify, at the database, the testing instructions and correlation criteria, and to transmit the testing instructions.

DETAILED DESCRIPTION

Figure 1:
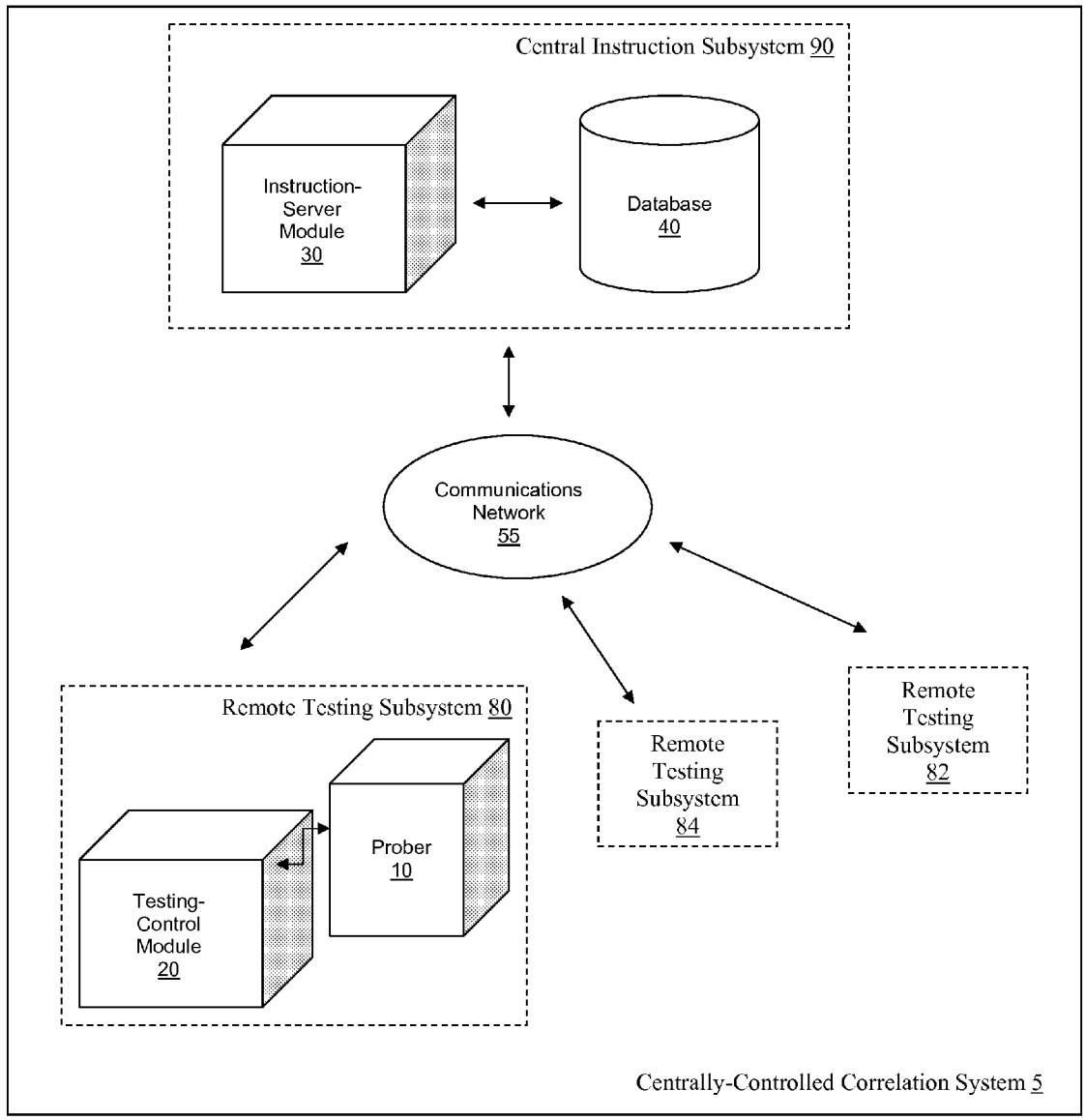
FIG. 1 is a schematic block diagram of an exemplary embodiment of a centrally-controlled correlation system in accordance with the present disclosure.

FIG. 1 illustrates an exemplary embodiment of a centrally controlled correlation system 5. The centrally controlled correlation system 5 may include a central instruction subsystem 90 in communication with remote testing subsystems 80, 82, 84 over a communications network 55.

The central instruction subsystem 90 is operable to provide testing instructions and correlation criteria to one or more remote testing subsystems 80, 82, and 84. Central instruction subsystem 90 may include an instruction-server module 30 and a database 40, which are communicatively coupled as shown. As used herein, "communicatively coupled" refers to the coupling of functional modules and/or subcomponents such that signals may be passed from one functional module to another. Such signals may be passed directly or indirectly, via direct connection, wireless connection, local area network(s), and/or wide area network(s) using conventional communication techniques. The database 40 holds the wafer-testing instructions and correlation criteria for a correlation wafer. The instruction-server module 30 retrieves the testing instructions and correlation criteria from the database 40.

Remote testing subsystem 80 provides an exemplary representation of a remote testing subsystem, and as illustrated, there may be one or more remote testing subsystems 80, 82, 84 in communication with central instruction subsystem 90. Each remote testing subsystem 80, 82, 84 is operable to test a correlation wafer and may include a prober 10 communicatively coupled to a testing-control module 20, as described in further detail later in this specification. In operation, within remote testing subsystem 80, the testing-control module 20 receives the testing instructions from the central instruction subsystem 90, and provides commands to the prober 10, to test the correlation wafer according to the testing instructions.

After having tested the correlation wafer, either the remote testing subsystem 80 or the central instruction subsystem 90 may apply the correlation criteria to determine the correlation data, such as the location and number of matching dice and whether the number of matching dice exceeds a threshold number. Using these correlation data, the correlation result may be determined. If the number of matching dice exceeds a threshold number, then the testing results and the previously-determined data correlate. In one embodiment, the central instruction subsystem 90 provides through communication network 55 the correlation criteria to the remote testing subsystem 80. The remote testing subsystem 80 then applies the correlation criteria to determine the correlation result. The remote testing subsystem 80 may also transmit the correlation result to the central instruction subsystem 90, which may then modify the testing instructions for future testing based on the correlation result. In another embodiment, the testing-subsystem 80 conducts the wafer-testing and transmits the testing results to the instruction subsystem 90 over communication network 55. The instruction subsystem 90 then compares the testing results with the previously-determined reference data and may modify the testing instructions for future testing based on the correlation result. By centralizing the distribution of the correlation criteria, every subcontractor may be able to apply substantially uniform correlation criteria and to reach more consistent correlation results. Moreover, the modification of the testing instructions at the central instruction subsystem 90 may allow subcontractors to test correlation wafers more efficiently.

As mentioned briefly above, communications network 55 may provide a conduit for communication of testing instructions and correlation criteria to the remote testing subsystems 80, 82, 84. The communication network 55 through which the central instruction subsystem 90 communicates with the remote subsystems may be a wide-area-network (WAN), a local-area-network (LAN), or a combination thereof. For example, in an embodiment, the remote testing subsystems such as subsystems 80, 82, and 84 are physically located at one or more geographically remote testing facilities and the central instruction subsystem 90 is located in a different central facility. The communication network 55 in this embodiment may include a wide-area-network. In an alternative embodiment, the central instruction subsystem 90 is geographically collocated in the same testing facility where one or more remote testing subsystems are located. In this embodiment, the communication network 55 through which the central instruction subsystem 90 communicates with the remote testing subsystems may comprise LAN(s) for the remote testing subsystem(s) that are geographically collocated with the central instruction subsystem 90, and a WAN to communicate between the geographically remotely-located remote testing subsystem(s) and the central instruction subsystem 90. In another alternative embodiment, the central instruction subsystem 90 and the remote testing subsystems 80, 82, 84 are located at one facility. The communication network in this embodiment may comprise at least one local-area-network.

System Components

Figure 2:
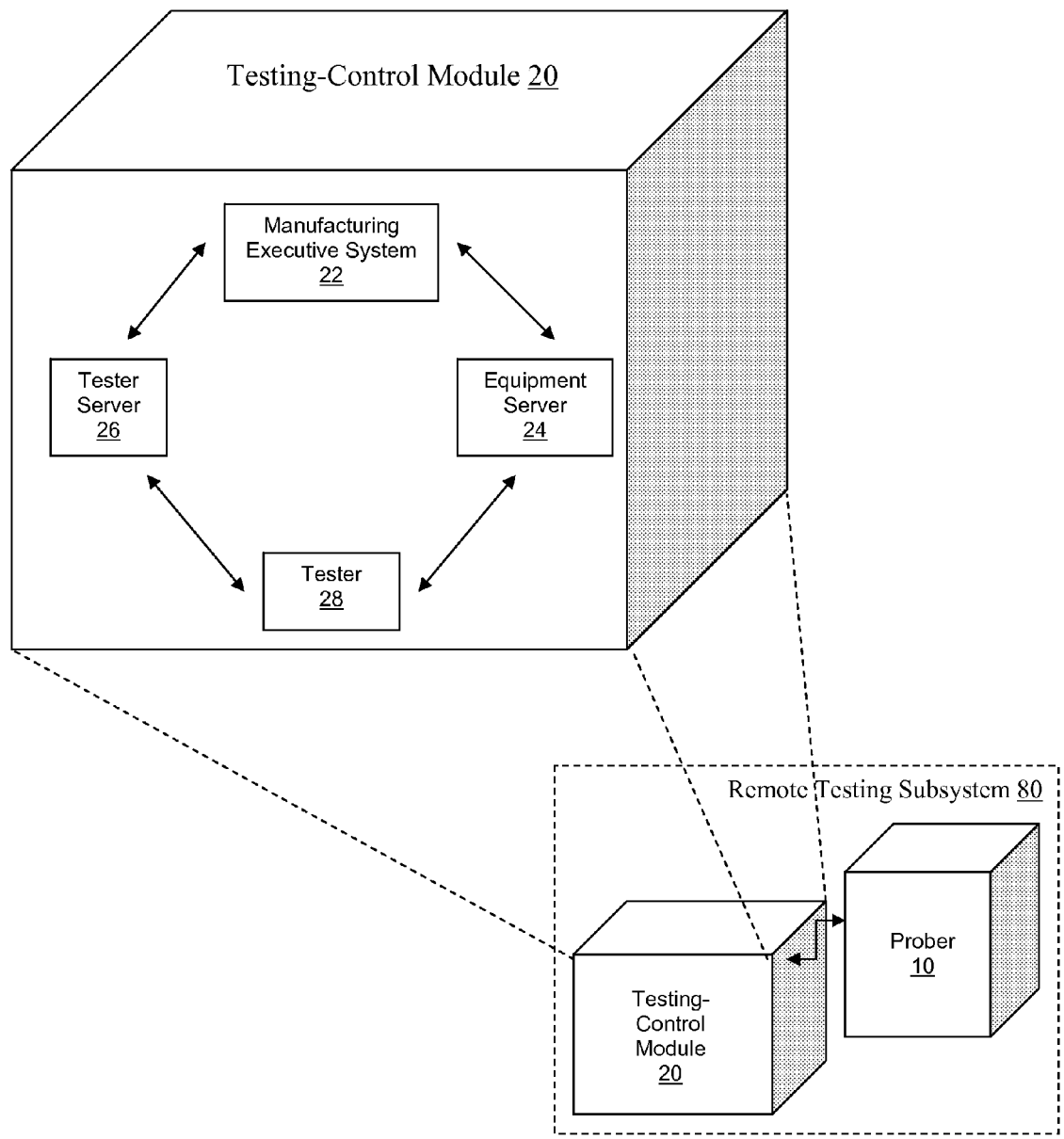
FIG. 2 is a schematic block diagram illustrating an exemplary embodiment of a testing-control module in accordance with the present disclosure.

Prober 10 includes a mechanical device that holds a probe card and probes the dice on a semiconductor wafer. It receives testing instructions from the testing-control module 20 and tests the correlation wafer according to the testing instructions. In an embodiment, the prober 10 may be a stand-alone device that communicates with the testing-control module 20 over a direct link, or a communication network, which can be either a LAN or WAN. Alternatively, in another embodiment, the prober 10 may be a part of a larger device that integrates the prober 10 and the testing-control module 20. The integrated device may comprise the entire testing-control module 20 or just some of its components. FIG. 2 shows an exemplary embodiment of the testing-control module 20. The testing-control module 20 may include one or more microcontrollers which collectively communicate with the central instruction subsystem 90 and control the prober 10. The one or more microcontrollers provide various functions, such as provision of the manufacturing executive system (MES) 22, equipment server 24, tester server 26, and the tester 28.

MES 22 is operable to identify a correlation wafer and initiate the testing of a correlation wafer. The MES 22 may initiate the correlation process by instructing other components of the testing-control module 20 to gather testing instructions. Equipment server 24 is operable to retrieve the previously-determined reference data and testing instructions from the central instruction subsystem 90. The reference data includes the previously-determined position information of the good and bad dice on the correlation wafer, and the testing instructions includes the position information of the specific dice that are going to be sampled. Tester server 26 is operable to store the test programs for testing a correlation wafer and the testing results. Tester 28 is operable to retrieve test programs from the tester server 26 and controls the prober 10 to test the dice according to the testing instructions. The tester 28 controls the prober 10 by executing the testing programs and outputting testing instructions. In an embodiment in which the remote testing subsystems conduct the correlation of the testing results to the reference data, the tester 28 may further be operable to retrieve, from the central instruction subsystem 90, the correlation criteria and apply them to determine the correlation results. The correlation criteria may be in the form of a computer script or in the form of a pointer pointing to a script stored in the tester server 26.

Figure 3:
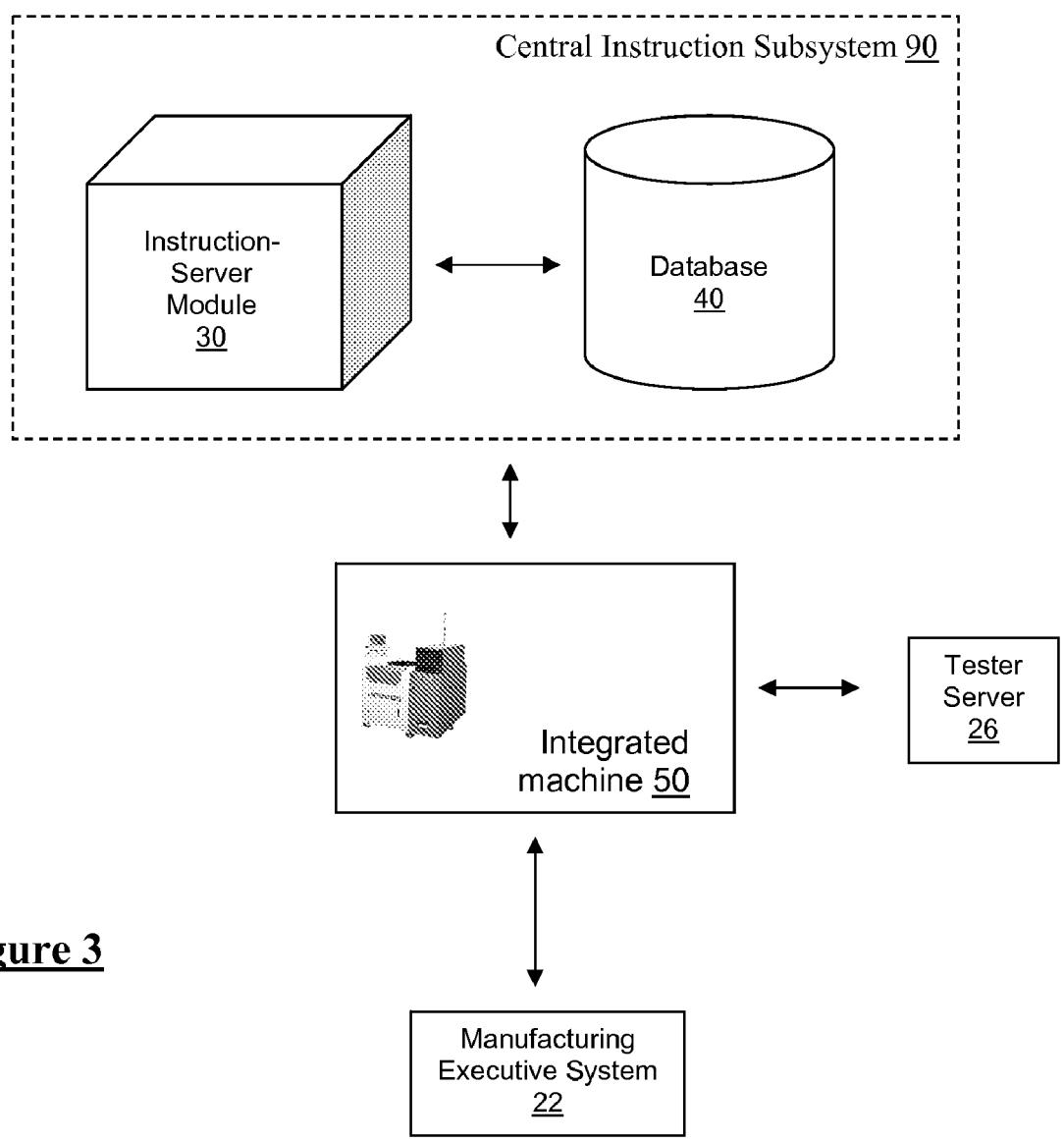
FIG. 3 is a schematic block diagram illustrating an exemplary embodiment of an integrated machine operable to obtain testing instructions for a correlation wafer and output the testing instructions as electrical signals.

In embodiments of the testing-control module 20, any two or more components 22-28 may be integrated into one microprocessor that performs the same tasks. For example, equipment server 24 and tester 28 may be integrated into one machine that is operable to obtain the testing instructions for a correlation wafer and output the testing instructions as electrical signals. A schematic block illustration of this exemplary embodiment is shown in FIG. 3. Equipment server 24, tester 28, and prober 10 are incorporated into an integrated machine 50, which retrieves the reference data and testing instructions from the central instruction subsystem 90, retrieves the testing programs from the tester server 26, and probes the correlation wafer (not shown). In an embodiment in which the remote testing subsystems conduct the correlation of testing results to reference data, the integrated machine 50 may further be operable to retrieve the correlation criteria from the central instruction system 90 and apply them to determine the correlation results.

Figure 4:
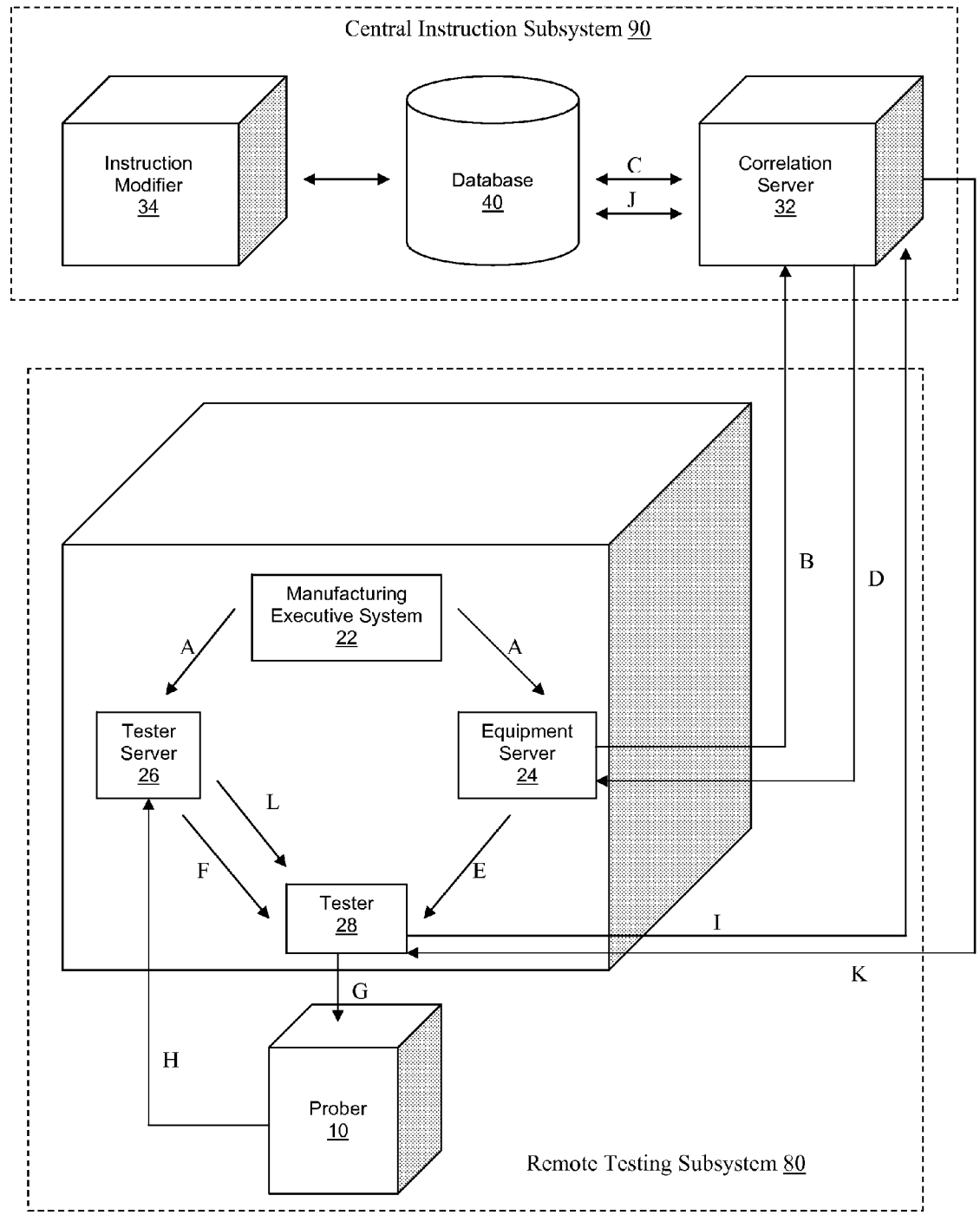
FIG. 4 is a schematic block diagram illustrating an exemplary correlation process in accordance with the present disclosure.

Referring to FIG. 4, the instruction-server module 30 of FIG. 1 may include a correlation server 32 and an instruction modifier 34. Correlation server 32 is operable to communicate with the database 40 and at least one remote testing subsystem, which is represented by subsystem 80. The correlation server 32 retrieves from the database 40 the testing instructions for a correlation wafer and provides them to remote testing subsystem 80. The testing instructions may be in the form of a location map indicating the position of the dice that require testing. In an embodiment in which the central instruction subsystem 90 conducts the correlation of testing results to reference data, the correlation server 32 is further operable to retrieve the correlation criteria from the database 40 and apply them to determine the correlation result. The correlation criteria in this embodiment may be in the form of a computer script. In another embodiment in which the remote testing subsystem 80 conducts the correlation of the testing results to the reference data, the correlation server 32 is operable to retrieve the correlation criteria from the database 40 and provide the instructions to the remote testing subsystem 80. The correlation criteria in this embodiment may be in the form of a computer script or in the form of a pointer pointing to a script stored in the tester server 26. In any embodiment, the instruction-server module 30 may be operable to obtain and use the correlation results to modify the testing instructions for testing the same correlation wafer in the future. The modifications can by done by the instruction modifier 34, which is dedicated to making modifications to the testing instructions. The modified testing instructions are transmitted to and saved in the database 40.

The database 40 comprises any storage media that holds information or a database. Database 40 is communicatively coupled to the instruction-server module 30, and may include any memory device known in the art, such as random access memory, a hard drive, removable computer media such as floppy disk, CD, DVD, solid state flash memory, or a combination thereof.

Correlation Process Steps

In an embodiment, the correlation system 5 involves the following general steps, which may be provided in this or another order: 1) transmitting, from the central instruction subsystem 90 to the remote testing subsystem 80, the reference data and testing instructions; 2) the remote testing subsystem 80 testing the correlation wafer according to the testing instructions; 3) transmitting, from the central instruction subsystem 90 to the remote testing subsystem 80, the correlation criteria; 4) the remote testing subsystem 80 applying the correlation criteria to determine the correlation result; and 5) transmitting, from the remote testing subsystem 80 to the central instruction subsystem 90, the correlation result and using them to modify the testing instruction for testing the correlation wafer in the future.

An exemplary correlation process is illustrated in FIG. 4, in which the process steps are labeled. When the MES 22 identifies a correlation wafer in the remote testing subsystem 80, it proceeds to initiate the correlation process. To initiate the process in step A, the MES 22 instructs the equipment server 24 to retrieve, from the central instruction subsystem 90, the previously-determined reference data and the testing instructions. The MES 22 also instructs the tester server 26 to provide the appropriate test programs to the tester 28. In step B, the equipment server 24 transmits, to the central instruction subsystem 90, a request for the previously determined reference data and the testing instructions for the correlation wafer that was identified by the MES 22. In step C, the correlation server 32 in the central instruction subsystem 90 receives the request that was sent from the equipment server 24 and identifies the requested reference data and testing instructions in the database 40. In step D, the correlation server 32 transmits the reference data and testing instructions to the equipment server 24 in the remote testing subsystem 80. In step E, the equipment server 24 transmits the reference data and testing instructions to the tester 28. In step F, the tester server 26 identifies the appropriate test programs for testing the correlation wafer that was identified by the MES 22; the tester server 26 then transmits the test programs to the tester 28. Step F does not have to be performed in sequence with any of steps B, C, D, and E. Thus, step F can be performed before, concurrently with, or after any of these steps. In step G, the tester 28 collects the reference data, testing instructions, and test programs for the correlation wafer and executes the testing instructions, which are the position information of the dice that are to be tested. The tester 28 then transmits signals to the prober 10 to test the correlation wafer. In step H, the prober physically makes electrical contact with the dice (one die at a time, or several dice at once) on the correlation wafer to test the functionality of the dice. As the prober 10 tests the dice on the correlation wafer, it sends the results back to the tester server 26 for storage.

After the testing is completed, the tester 28 in step I may send a request to the central instruction subsystem 90 for the correlation criteria. In step J, the correlation server 32 may identify within the database 40 the requested correlation criteria and in step K, transmit the correlation criteria to the tester 28. The correlation criteria may be in the form of a computer script or in the form of a pointer pointing to a script stored in the tester server 26. In step L, the tester 28 may retrieve the testing results from the tester server 26 and apply the correlation criteria to determine the correlation result. In an alternative embodiment, steps I, J, K, and L may be eliminated. Instead, the correlation server 32 may retrieve from the tester server 26, the testing results, and from the database 40, the correlation criteria and the previously-determined reference data. The correlation server 32 then apply the correlation criteria to determine the correlation result.

After the correlation result is determined, the correlation result may be transmitted to an instruction modifier 34, which may use the correlation result to modify the testing instructions for testing the same correlation wafer in the future. Based on the correlation result, the instruction modifier 34 may apply a statistical model to determine a more efficient sampling of the correlation wafer. In one embodiment, the statistical model used for calculating sample size is based on the equation:

$$n=[p*q(N/(N-1))]/[(\epsilon/Z)^2+(p*q)/(N-1)]$$

where "n" is the sample size, "N" is the number of gross dice, "p" is the percentages of non-matching dice, "q" is the value of "p" subtracted from 1, "$\epsilon$" is the acceptable measurement resolution, and "Z" is the confidence level. The acceptable measurement resolution and confidence level are arbitrary values that can be varied to achieve different testing qualities. Since the number of gross dice is fixed and the acceptable measurement resolution and the confidence level values are arbitrary, a new sample size may be determined after determining the percentage of non-matching dice. The application of this model may generate a sample size that is smaller while maintaining the same testing qualities.

While various embodiments of central correlation systems and methods of centrally correlating and testing semiconductor wafers according to the principles disclosed herein have been described above, it should be understood that they have been presented by way of example only, and not limitation. Accordingly, the following claims should be construed broadly to cover any embodiment tailored to achieve the principles disclosed herein. Thus, the breadth and scope of the invention(s) should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A system for wafer correlation, wherein a correlation wafer is tested and its testing results are compared to its previously-determined reference data, the system comprising:

a database operable to store testing instructions for testing the correlation wafer and correlation criteria for comparing the testing results with the previously-determined reference data;

an instruction-server module operable to identify, at the database, the testing instructions and the correlation criteria and to transmit the testing instructions and correlation criteria;

a testing-control module operable to receive the testing instructions and correlation criteria from the instruction-server module and to output electrical signals according to the testing instructions; and a prober operable to test the correlation wafer according to the electrical signals;

wherein the testing-control module is operable to apply the correlation criteria and to transmit correlation data to the instruction-server module, wherein the correlation data comprise a count of matching and non-matching dice, and wherein the instruction-server module is further operable to apply a statistical model to the correlation data to generate new testing instructions, the new testing instructions stored in the database.

2. A system according to claim 1, wherein the instruction-server module comprises:

a first server operable to transmit to the testing-control module the testing instructions and the correlation criteria; and a second server operable to receive the correlation data from the testing-control module and generate the new testing instructions.

3. A system according to claim 1, wherein the testing instructions for testing the correlation wafer comprise position information of dice that are required to be tested.

4. A system according to claim 1, wherein the correlation criteria comprise a script that can be run by a computer.

5. A method for wafer correlation, wherein a correlation wafer is tested and its testing results are compared to its previously-determined reference data, the method comprising:
- identifying at a database, testing instructions for testing the correlation wafer and correlation criteria for comparing the testing results with the previously-determined reference data;
- transmitting from an instruction-server module to a testing-control module, the testing instructions;
- transmitting the correlation criteria from the instruction-server module to the testing-control module, wherein the correlation criteria is operable to be applied by the testing-control module;
- receiving, in the instruction-server module, correlation data from the testing-control module, wherein the correlation data comprises a count of matching and non-matching dice; and
- applying, in the instruction-server module, a statistical model to the correlation data to generate new testing instructions for testing the correlation wafer.

6. A method according to claim 5, further comprising storing, in the database, the new testing instructions.

7. A method according to claim 5, further comprising receiving in the instruction-server module, a request from the testing-control module for the correlation criteria.

8. A method according to claim 5, wherein the testing instructions are operable to command the testing-control module to output electrical signals that would in turn command a prober to test the correlation wafer and transmit the testing results back to the testing-control module.

9. A method according to claim 5, further comprising receiving in the instruction-server module, a request from the testing-control module for the testing instructions.

10. An instruction system for wafer correlation, wherein a correlation wafer is tested and its testing results are compared to its previously-determined reference data, the system comprising:
- a database operable to store the testing instructions for testing the correlation wafer and correlation criteria for comparing the testing results with the previously-determined reference data; and
- an instruction-server module operable to identify, at the database, the testing instructions and correlation criteria, and to transmit the testing instructions and the correlation criteria to a testing-control module, wherein the instruction-server module is further operable to receive correlation data and apply a statistical model to the correlation data to generate new testing instructions, and the correlation data comprises a count of matching and non-matching dice.

11. A system according to claim 10, wherein the instruction-server module is operable to receive the testing results and to apply the correlation criteria to compare the testing results with the previously-determine reference data.

12. A system according to claim 10, wherein the instruction-server module comprises:
- a first server operable to identify, at the database, the testing instructions and correlation criteria, and to transmit the testing instructions;
- a second server operable to receive the correlation data and apply the statistical model to the correlation data to generate the new testing instructions.

13. A system according to claim 12, wherein the second server is operable to transmit the new testing instructions to the database.

14. A system according to claim 10, wherein the instruction-server module is operable to receive a request from the testing-control module for the correlation criteria.

* * * * *